(12) United States Patent
Tiphine et al.

(10) Patent No.: US 9,922,159 B2
(45) Date of Patent: *Mar. 20, 2018

(54) FREE FORM FRACTURING METHOD FOR ELECTRONIC OR OPTICAL LITHOGRAPHY

(71) Applicant: ASELTA NANOGRAPHICS, Grenoble (FR)

(72) Inventors: Charles Tiphine, Echirolles (FR); Thomas Quaglio, Grenoble (FR); Luc Martin, Saint Martin le Vinoux (FR)

(73) Assignee: ASELTA NANOGRAPHICS, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/616,617

(22) Filed: Feb. 6, 2015

(65) Prior Publication Data

US 2015/0154344 A1    Jun. 4, 2015

Related U.S. Application Data

(63) Continuation of application No. 13/774,534, filed on Feb. 22, 2013, now Pat. No. 8,984,451.

(51) Int. Cl.
*G06F 17/50* (2006.01)
*H01J 37/302* (2006.01)
(Continued)

(52) U.S. Cl.
CPC .......... *G06F 17/5081* (2013.01); *B82Y 10/00* (2013.01); *B82Y 40/00* (2013.01);
(Continued)

(58) Field of Classification Search
CPC ........ G03F 1/144; G03F 1/36; G06F 17/5081; G06F 17/50; B82Y 40/00; B82Y 10/00;
(Continued)

(56) References Cited

U.S. PATENT DOCUMENTS 4,797,842 A * 1/1989 Nackman ................ G06T 17/20
                                                     345/420
6,094,199 A    7/2000 Turkiyyah et al.
(Continued)

FOREIGN PATENT DOCUMENTS

JP   H03205815 A   9/1991
JP    05175107 A   7/1993
(Continued)

OTHER PUBLICATIONS

Partial International Search Report dated Nov. 5, 2013, for International Application No. PCT/EP2013/053883.
(Continued)

*Primary Examiner* — Jack Chiang
*Assistant Examiner* — Brandon Bowers
(74) *Attorney, Agent, or Firm* — Baker & Hostetler LLP

(57) ABSTRACT

The invention discloses a computer implemented method of fracturing a surface into elementary features wherein the desired pattern has a rectilinear or curvilinear form. Depending upon the desired pattern, a first fracturing will be performed of a non-overlapping or an overlapping type. If the desired pattern is resolution critical, it will be advantageous to perform a second fracturing step using eRIFs. These eRIFs will be positioned either on the edges or on the medial axis or skeleton of the desired pattern. The invention further discloses method steps to define the position and shape of the elementary features used for the first and second fracturing steps.

4 Claims, 9 Drawing Sheets

(51) Int. Cl.
  *H01J 37/317* (2006.01)
  *B82Y 10/00* (2011.01)
  *B82Y 40/00* (2011.01)
(52) U.S. Cl.
  CPC .......... *G06F 17/50* (2013.01); *H01J 37/3026* (2013.01); *H01J 37/3174* (2013.01); *H01J 2237/31764* (2013.01); *H01J 2237/31776* (2013.01)
(58) Field of Classification Search
  CPC ............... H01J 37/3026; H01J 37/3174; H01J 2237/31764; H01J 2237/31776
  USPC .......................................................... 716/53
  See application file for complete search history.

(56) References Cited

U.S. PATENT DOCUMENTS

| | | | |
|---|---|---|---|
| 6,275,604 | B1 | 8/2001 | Miyajima et al. |
| 7,010,764 | B2 * | 3/2006 | Pierrat ................ G06F 17/5068 430/30 |
| 7,901,850 | B2 | 3/2011 | Fujimura et al. |
| 2006/0169925 | A1 | 8/2006 | Miyajima et al. |
| 2008/0054196 | A1 | 3/2008 | Hiroshima |
| 2010/0058282 | A1 * | 3/2010 | Fujimura ............... B82Y 10/00 716/55 |
| 2011/0089344 | A1 | 4/2011 | Fujimura et al. |

FOREIGN PATENT DOCUMENTS

| | | |
|---|---|---|
| JP | 112258771 A | 9/1999 |
| JP | 2002/367901 A | 12/2002 |
| JP | 2006/126823 A | 5/2006 |
| JP | 2008/066441 A | 3/2008 |
| JP | 2010-062562 A | 3/2010 |
| JP | 2012/501475 A | 1/2012 |
| WO | 2009/001403 A1 | 12/2008 |
| WO | 2011/128393 A1 | 10/2011 |

OTHER PUBLICATIONS

Aichholzer, O. and Aurenhammer, F., "Straight Skeletons for General Polygonal Figures in the Plane," Proc. 2nd Ann. Int. Conf. Computing and Combinatorics (COCOON '95). Lecture Notes in Computer Science, No. 1090, Springer-Verlag, pp. 117-126.

Attali, D. et al., "Stability and Computation of Medial axes—a State-of-the-Art Report," B. Hamann T. Moller and B. Russell (eds.) Mathematical Foundations of Scientific Visualization. Computer Graphics, and Massive Data Exploration, Springer-Verlag, Mathematics and Visualization (2007), pp. 1-18.

Office Action in European Patent Application No. 13706532.2, dated Jul. 12, 2016.

Dominique Attall et al.; "Stability and Computation of Medial Axes—a State-of-the-Art Report"; Mathematical Foundations of Scientific Visualization, Computer Graphics, and Massive Data Exploration; Mar. 25, 2009; pp. 109-125.

Aichholzer et al.; "Straight Skeletons for General Polygonal Figures in the Plane"; Proceeding COCOON '96 Proceedings of the Second Annual International Conference on Computing and Combinatorics; Jun. 17-19, 1996; pp. 117-126.

Notice of Rejection issued in Japanese Patent Application No. 2015-558359, dated Jul. 4, 2017.

* cited by examiner

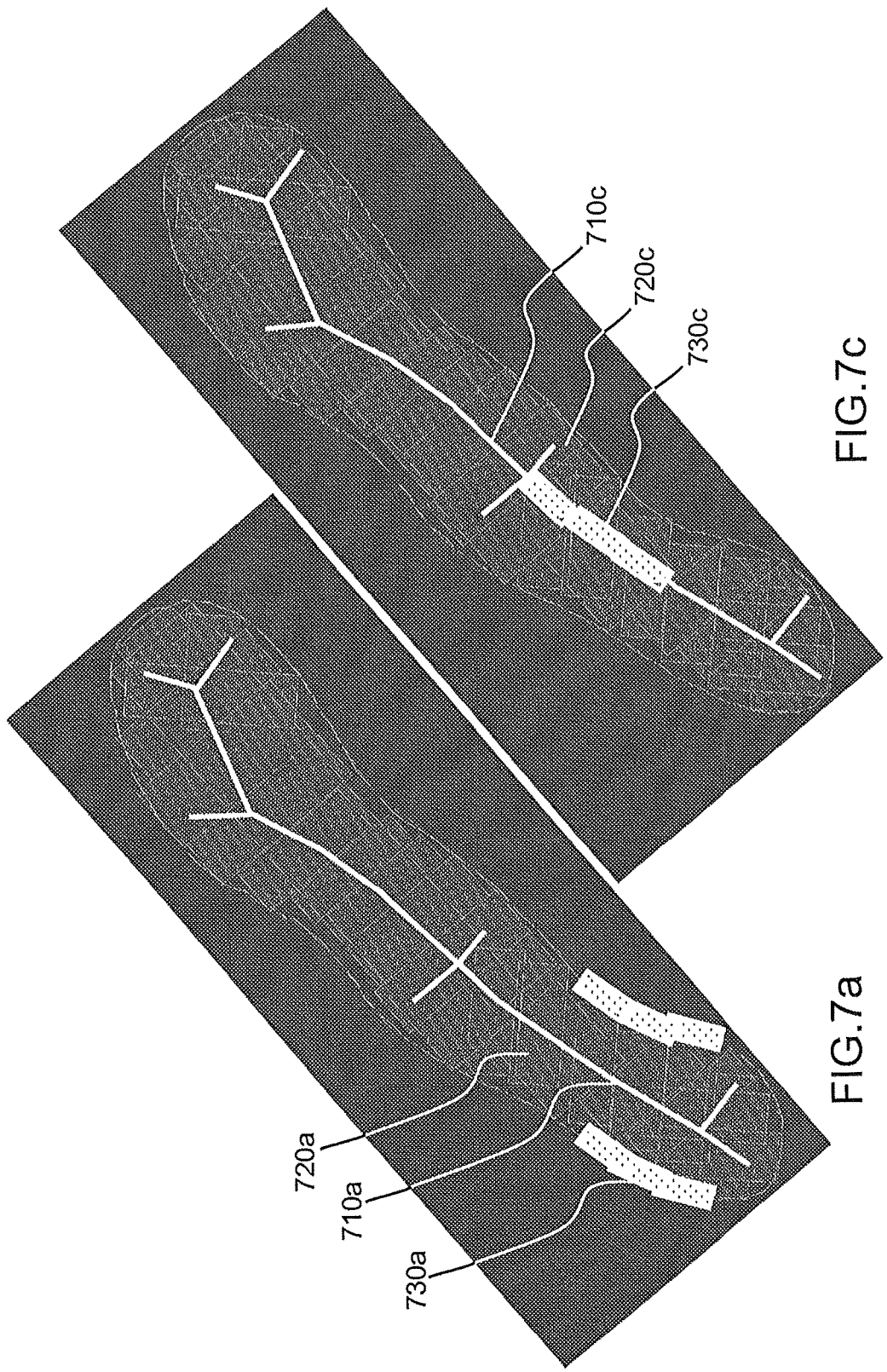

FREE FORM FRACTURING METHOD FOR ELECTRONIC OR OPTICAL LITHOGRAPHY

CROSS-REFERENCE TO RELATED APPLICATIONS

This application is a continuation of U.S. patent application Ser. No. 13/774,534, filed on Feb. 22, 2013, entitled "Free Form Fracturing Method For Electronic or Optical Lithography" of which is incorporated herein by reference in its entirety.

FIELD OF THE INVENTION

The present invention notably applies to the field of electronic or optical lithography of masks for transferring designs on to a substrate. It also applies to processes whereby an electron beam is used to directly write a pattern on a substrate or mask.

BACKGROUND

One way of transferring a pattern on to a surface by e-beam lithography is to use a variable shaped beam or VSB to reveal a positive or negative resist coating. For doing so, during a fracturing step, the pattern is to be cut into elementary forms to which a radiation dose is assigned (known as "shots"). Geometry and radiation dose of the shots are closely interrelated because, at the dimensions which are now used (technologies with a critical dimension or "CD" of less than 25 nm), the proximity effects (forward scattering and backward scattering) largely depend on the density of the exposed area.

The patterns to be transferred are quite often of a simple geometric form, such as thin rectangles (lines) or squares (interconnections). In these circumstances, the geometry of the shots is defined accordingly and is also simple: each pattern is fractured into a union of rectangular or square shots.

Nevertheless, for a number of applications (inverse lithography, photonics, metrology calibration, etc . . . ), it may be necessary or advantageous to include in the design patterns which are not simple forms of the type previously described, but which may be circles or of an indeterminate, possibly curvilinear, form (further referred to as free-form)

It will also be advantageous to be able to transfer on a mask resolution free-form assist features to better correct the proximity effects in the case of a very low CD.

Under these circumstances traditional fracturing is not advantageous because it generates a very high number of shots, especially when pattern fidelity is critical. The writing time increases proportionally to the number of shots, which in turns increases significantly the cost of producing masks or wafers.

Moreover, independently of the lithography tool, traditional fracturing generates a huge amount of data which is challenging for data storage and transfer. This amount of data is also a critical issue when computing proximity effect correction.

It would therefore be advantageous to use a fracturing method capable of adapting itself to indeterminate forms of patterns to be transferred onto a surface, while taking the maximum benefit of the capacities of the e-beam equipment and software. An attempt in this direction is discussed in U.S. Pat. No. 7,901,850 which discloses an assembly method wherein rectangular and/or triangular shots are assembled in glyphs and superposed in order to pave circular or curvilinear patterns.

But this prior art document fails to disclose a solution which would be providing a fracturing methodology capable of addressing various operational constraints such as contour roughness and/or resolution targets and/or the geometries of shots available on the e-beam equipment.

SUMMARY OF THE INVENTION

It is an object of the present invention to provide a solution to this problem.

To this effect, the invention first discloses a computer implemented method of fracturing a surface into elementary features, said elementary features to be each exposed to at least one shot of a variable shaped beam (VSB) to transfer a free-form desired pattern onto the surface, said method comprising a step of determining a topological skeleton of the free-form desired pattern.

Advantageously, the step of determining a topological skeleton of the free-form desired pattern comprises a step of determining at least one of a medial axis and a straight skeleton of the free-form desired pattern.

Advantageously, the step of determining at least one medial axis of the free-form desired pattern comprises a first step of determining an approximated form of the free-form desired pattern and a second step of applying a Voronoï diagrams algorithm to the approximated form.

Advantageously, the step of determining a topological skeleton of the free-form desired pattern comprises a step of determining at least one straight skeleton of the free-form desired pattern as a set of points comprising loci of vertices of polygons which are first determined as paving the free-form desired pattern.

In another embodiment, the invention discloses a computer implemented method of fracturing a surface into elementary features, said elementary features to be each exposed to at least one shot of a variable shaped beam (VSB) to transfer a free-form desired pattern onto the surface, said method comprising a step of taking into account as parameters, the VSB tool available directions.

Advantageously, the VSB tool available directions are selected in a group comprising directions forming an angle with an axis of the surface of 0°, 15°, 30°, 45°, 60°, 75°, 90°, 105°, 120°, 135°, 150°, 165°, 180°.

In another embodiment, the invention discloses a computer implemented method of fracturing a surface into elementary features, said elementary features to be each exposed to at least one shot of a variable shaped beam (VSB) to transfer a free-form desired pattern onto the surface, said method comprising a step of simulating a contour of the fractured design and a step of determining a distance between the simulated contour of the fractured design and a contour of the free-form desired pattern.

Advantageously, the method of the invention, according to this embodiment, further comprises a step of taking into account as a parameter a limit of the distance between the simulated contour of the fractured design and a contour of the free-form desired pattern.

In another embodiment, the invention discloses a computer implemented method of fracturing a surface into elementary features, said elementary features to be each exposed to at least one shot of a variable shaped beam (VSB) to transfer a free-form desired pattern onto the surface, said method comprising: a step of determining a topological skeleton of the freeform desired pattern; a step of taking into account as parameters, the VSB tool available directions; a step of simulating a contour of the fractured design and a step of determining a distance between the simulated contour of the fractured design and a contour of the free-form desired pattern.

Advantageously, the method of the invention, according to this embodiment, further comprises a step of selecting at least one tool available direction close to a direction of a segment of the topological skeleton.

Advantageously, the method of the invention, according to this embodiment, further comprises a step of defining the elementary features as rectangles substantially centered on the topological skeleton of the free-form desired pattern and having a available direction substantially parallel to a VSB tool available direction, said rectangles having each a size which is maximal under the constraint that the distance between the simulated contour of the fractured design and a contour of the free-form desired pattern stays within a predetermined roughness tolerance.

Advantageously, at least one of a center, an orientation and a width of an elementary feature are adjusted as a function of at least one parameter of a group of parameters of the VSB process and the predetermined limit roughness tolerance for the free-form desired pattern, said adjusting being based on a minimization of the difference of the surface of the union of the elementary features with the desired pattern.

Advantageously, the group of parameters of the VSB process comprises available shot orientations, maximum shot size, characteristic dimension of the point spread function (PSF), maximum shot size and maximum overlap.

Advantageously, some of the elementary features are overlapping and a missing shot orientation is substituted by a change in the amount of overlap between some of the said overlapping elementary features.

Advantageously, the width of an elementary feature is calculated as a function of the maximum shot size, a characteristic dimension of the PSF of the VSB process and the roughness tolerance for the desired pattern.

Advantageously, the length of an elementary feature is calculated as a function of the maximum shot size of the VSB process, the local width of the free-form desired pattern and at least one rule in a group of categorical rules.

Advantageously, the group of categorical rules comprises stop at mid width, go to opposite edge of desired pattern, stop at a preset width.

Advantageously, the method of the invention, according to this embodiment, further comprises a step of reducing the action of a proximity effect correction on corner rounding.

Advantageously, the method of the invention, according to this embodiment, further comprises a step of determining as a parameter a threshold for a required resolution of the transferred pattern.

Advantageously, the threshold parameter for the required resolution is such that the critical dimension (CD) of the process is lower than $2\alpha$, a being the characteristic dimension of the forward scattering part of the PSF of the process.

Advantageously, the method of the invention, according to this embodiment, further comprises a step of determining a second set of elementary features of a sub-resolution type to be transferred to the surface in addition to a first set of elementary features of a resolution type, when the required resolution is higher than the threshold parameter.

Advantageously, the positions of the centers of the elementary features of the sub-resolution type are determined by drawing at least one center curve approximating one the topological skeleton of the edges and the medial axis of the desired pattern.

Under the main constraints discussed above (criticality of the resolution and constraints imposed on the geometry of the shots by the e-beam equipment), the invention allows a minimization of the number of shots and therefore of the write time on the surface. The invention also allows a minimization of the roughness of the contour of the transferred patterns. In various embodiments, a loop between the fracturing and the proximity effect correction steps is included to take advantage of the corner rounding effects which occur at sharp angles between shots. It is thus possible to replace fracturing angles which are not available in the equipment which is being used. It is indeed quite infrequent that e-beam equipment can fracture shots with angles to the Cartesian frame of reference different from 90° or 45°, although 30° or 60° may be available in certain cases.

When resolution is highly critical, according to the invention, it will be possible to optimize contrast and contour grain at the same time by superposing (<<electron Resolution Improvement Features>> or eRIF) to a coarse paving.

In certain embodiments, the automating placing of the elementary features and/or eRIF is very cost effective in terms of computing power and time.

BRIEF DESCRIPTION OF THE DRAWINGS

The invention will be better understood and its various features and advantages will become apparent from the description of various embodiments and of the following appended figures:

FIGS. 7a and 7c respectively represent two different embodiments of an addition of eRIF to a paving in various embodiments of the invention while

DETAILED DESCRIPTION

FIGS. 1a, 1b, 1c and 1d respectively represent a pattern to be transferred, two fracturing methods of the prior art and a fracturing method according to an embodiment of the invention.

Figure 1A:
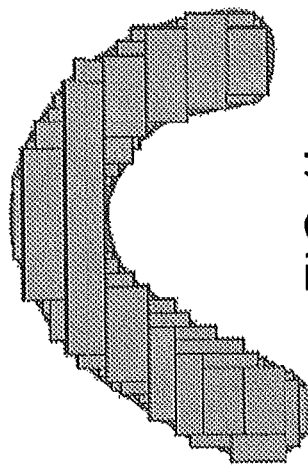
FIGS. 1a, 1b, 1c and 1d respectively represent a pattern to be transferred, two fracturing methods of the prior art and a fracturing method according to an embodiment of the invention.

To improve the resolution of some features such as contacts on CMOS integrated circuits, features of the type depicted on FIG. 1a will very soon have to be transferred on to the surface of a mask. Standard fracturing of the type depicted on FIG. 1b would result in a dramatic increase in the number of shots when compared with a feature of a Manhattan geometry (i.e. with lines which are horizontal and vertical).

Figure 1B:
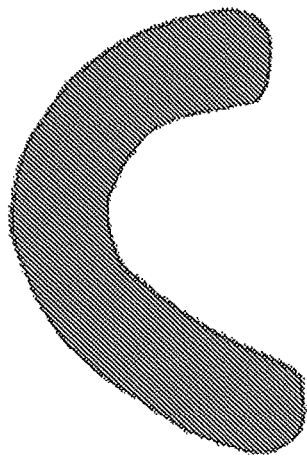
Figure 1C:
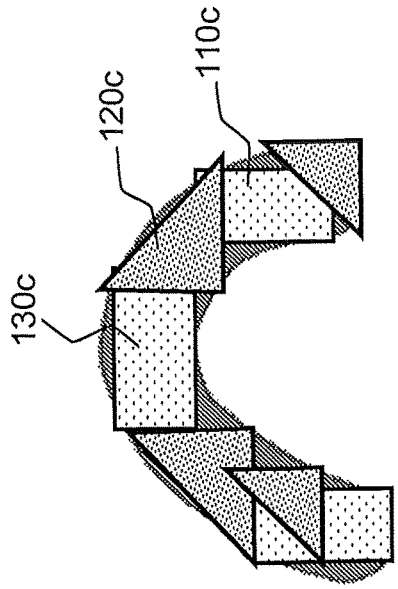
Figure 1D:
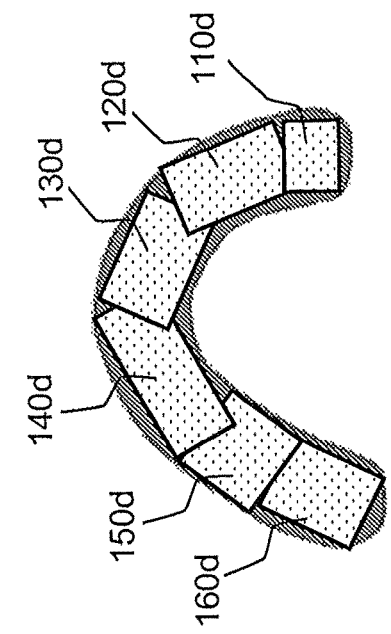

FIG. 1c represents a solution of the prior art to the problem illustrated by FIG. 1b. According to this solution, disclosed for instance in U.S. Pat. No. 7,901,850, shots of a rectangular (110c, 130c, the latter being tilted at 90° in relation to the former) or a triangular (120c) form are positioned along the curvilinear pattern so as to cover the maximum percentage of the surface of the pattern. But the number of shots will still remain important and it will be very difficult to achieve a good resolution because the calculation of the dosage of each shot, taking due account of all the proximity effects, will be very complex due to the variability of the overlap which is necessary to achieve a good matching within a reasonable tolerance between the group of overlapping features and the target pattern.

According to one aspect of the invention, the overlapping shots (110d, 120d, 130d, 140d, 150d, 160d) are tilted at various angles and may therefore conform to the geometry of the target pattern more readily. Also, the overlap may be limited accordingly which will render the calculation of the proximity effect corrections less complex than in the process of the prior art. Of course the equipment available may be limited to the performance of certain values of the tilt. The invention also teaches how to overcome the possible drawbacks of this situation further down in the description.

Figure 2:
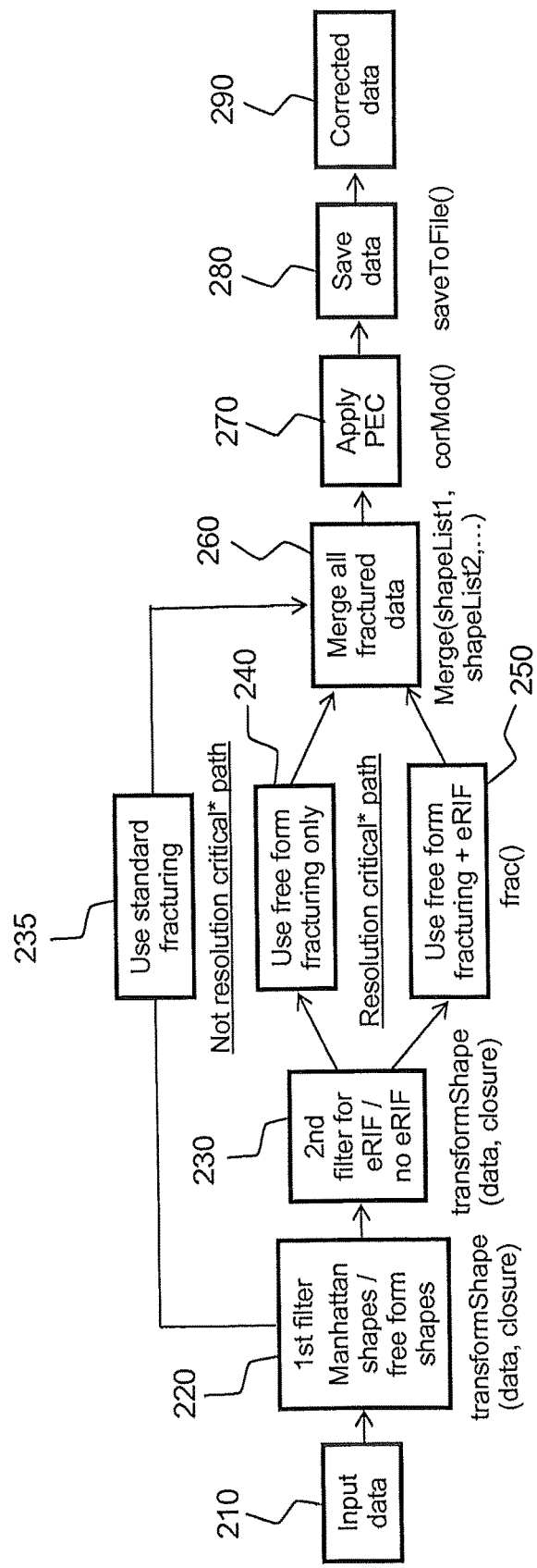
FIG. 2 represents a high level flow chart of the processes performed according to the invention in a number of its embodiments.

FIG. 2 represents a high level flow chart of the processes performed according to the invention in a number of its embodiments.

At step 210, data representing the desired pattern (for instance the desired pattern of FIG. 1a) is input into the fracturing software. At step 220, a first filter is applied to determine if the desired pattern is of a form requiring specific fracturing.

The type of the desired pattern is tested. If the desired pattern (or a portion thereof) is of a Manhattan type, a fracturing into elementary features which do not overlap will be applied. This fracturing is standard and nor part of this invention.

If the desired pattern (or a portion thereof) is free-form (like is the case of the desired pattern of FIG. 1a), free form fracturing according to the invention will be applied. Free form fracturing can be of two types, without overlaps or with overlaps. The former, where the elementary features of the paving are not at all superimposed, is more reliable and is easier when performing corrections. The latter, where at least portions of the elementary features of the paving are superimposed. In both cases, a second characteristic of the desired pattern will be tested at step 230. This test consists in determining if the desired pattern is resolution critical. The determination is based on the relationship between the size of the desired pattern (its lowest dimension or Critical Dimension or CD) and the a parameter of the Point Spread Function (PSF). This parameter represents the distance to which the forward scattering of the beam is active.

As exemplary and non limiting embodiment of the invention, a threshold for this test can be set at $2\alpha$. This means that, if the CD of the desired pattern is lower than $2\alpha$, the desired pattern will be considered to be resolution critical. If the CD of the desired pattern is higher than this threshold, the fracturing will be performed in a one step process to determine a set of overlapping features which best fit the desired pattern, at step 240.

If the required resolution of the desired pattern is higher than the preset threshold, the computer will decide to apply a two-step process for fracturing the desired pattern (step 250 of the method):
  First, the desired pattern will be approximated by a set of overlapping features; the determination of this type of elementary features will be described in relation to FIGS. 5a, 5b, 6a and 6b;
  Second, electron sub-resolution features will be added to the elementary features; sub-resolution features are substantially of a dimension which is smaller than the dimension of the desired pattern; sub-resolution features are, for instance, electron Resolution Improvement Feature or eRIF); the determination of this type of elementary features will be described in relation to FIGS. 7a, 7b, 7c.

Then, as is the case in all traditional fracturing methods, the fractured data will be merged at step 260.

Further, Proximity Effect Corrections (or PEC) will be applied at step 270. It is possible to include a loop between step 240 (or 250) and step 270 to correct the fractured data in a number of cases where this will yield better results. For instance, traditional PEC algorithms may decrease the corner rounding of a number or features to increase the resolution, whereas it may be desirable to leave a corner rounding to diminish the roughness of the edge of the pattern to be transferred. In this case, the corner rounding PEC will be cancelled or modified.

Then, the fractured data will be saved (step 280) as corrected data (step 290).

Figures 3A, 3B, 3C:
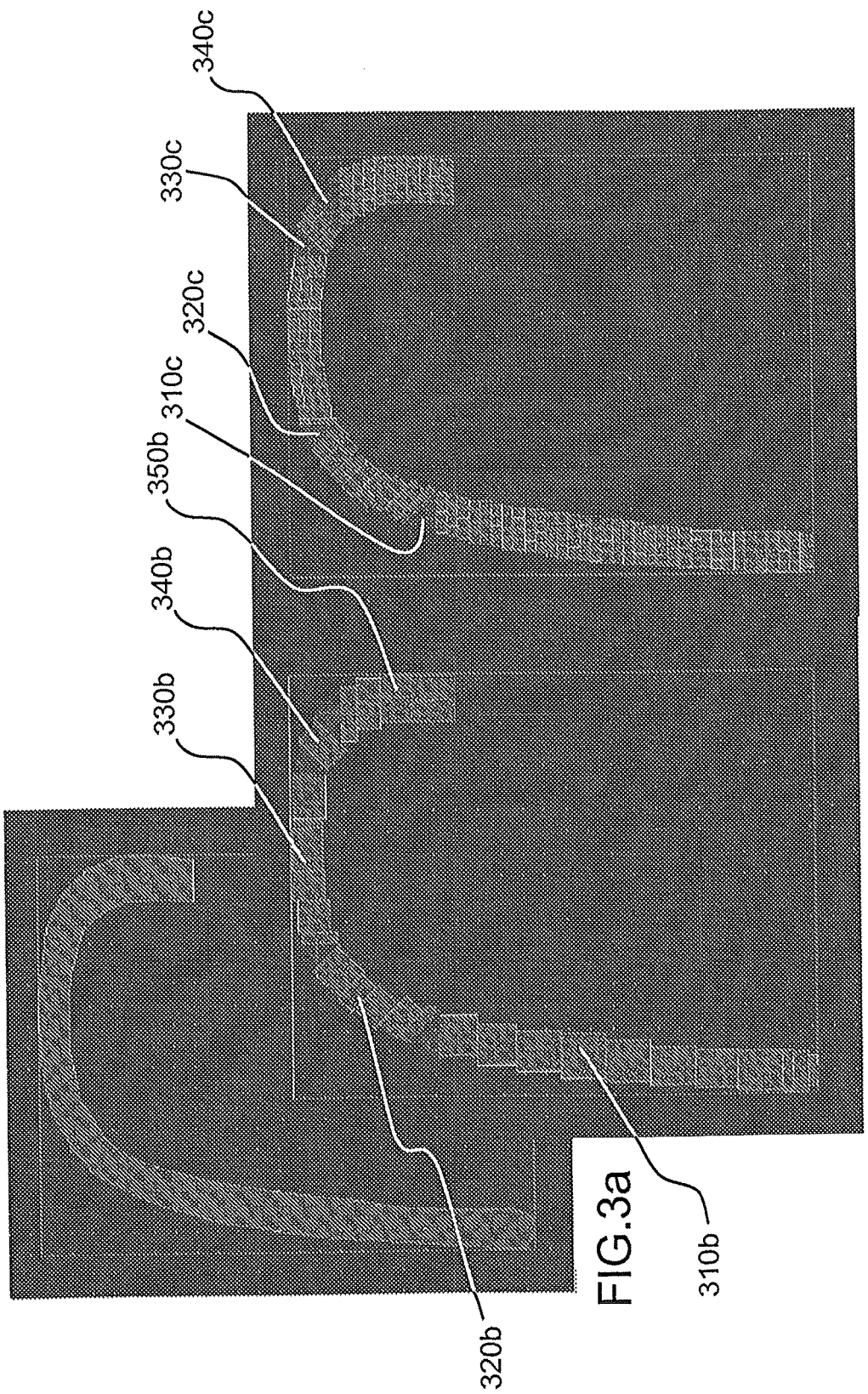
FIGS. 3a, 3b and 3c respectively represent a pattern to be transferred and one fracturing method using two different sets of parameters according to different embodiments of the invention.

FIGS. 3a, 3b and 3c respectively represent a pattern to be transferred and one fracturing method using two different sets of parameters according to different embodiments of the invention.

VSB tools allow using a limited number of shapes, typically rectangles or triangles with a limited number of directions. One can usually use rectangles at 0 or 90° angle but some tools also allow rectangles of 45° angles. These directions will later be referred to as the tool available directions.

FIG. 3a represents a desired pattern which can be cut into unidirectional sub-patterns separated by one or more transition sub-pattern(s). These sub-patterns will be divided into one or several shots in a further step.

A first possible fracturing is represented on FIG. 3b, where five subpatterns 310b, 320b, 330b, 340b and 350b are determined to be unidirectional. Each unidirectional sub-pattern can be associated to a single tool available direction. The fracturing method of the invention for these five sub-patterns will be explained in detail in relation to FIGS. 4a, 4b and 4c.

The transitional sub-patterns are fractured using a standard fracturing like the fracturing used for machine file formats or inside VSB tools.

A second fracturing example is represented on FIG. 3c, with a different parameter set.

Figure 4A:
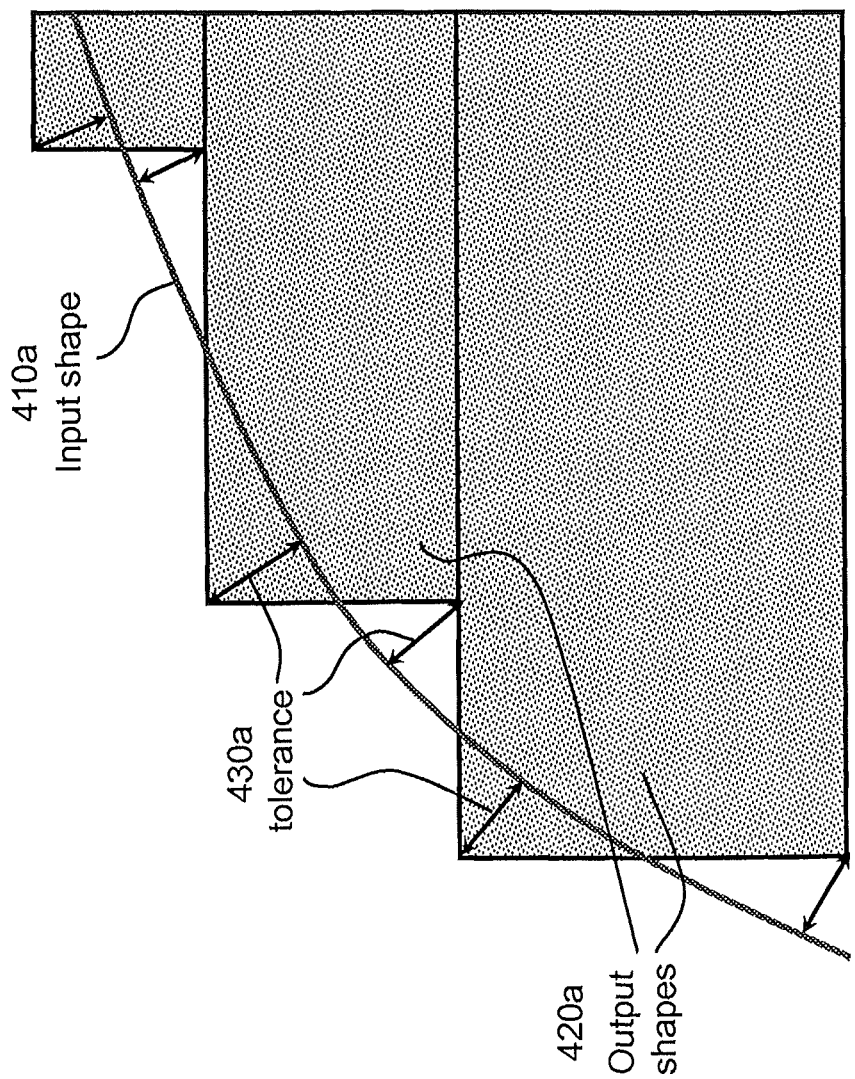
FIG. 4a illustrates the definition of the tolerance as the maximum limit of the distance between the elementary features of the fracturing and the desired pattern.

For free form fracturing methods, a distance between the elementary features of the fracturing and the desired pattern is defined as represented on FIG. 4a. We define the tolerance as the maximum limit of this distance. This tolerance is set by the user.

Figure 4C:
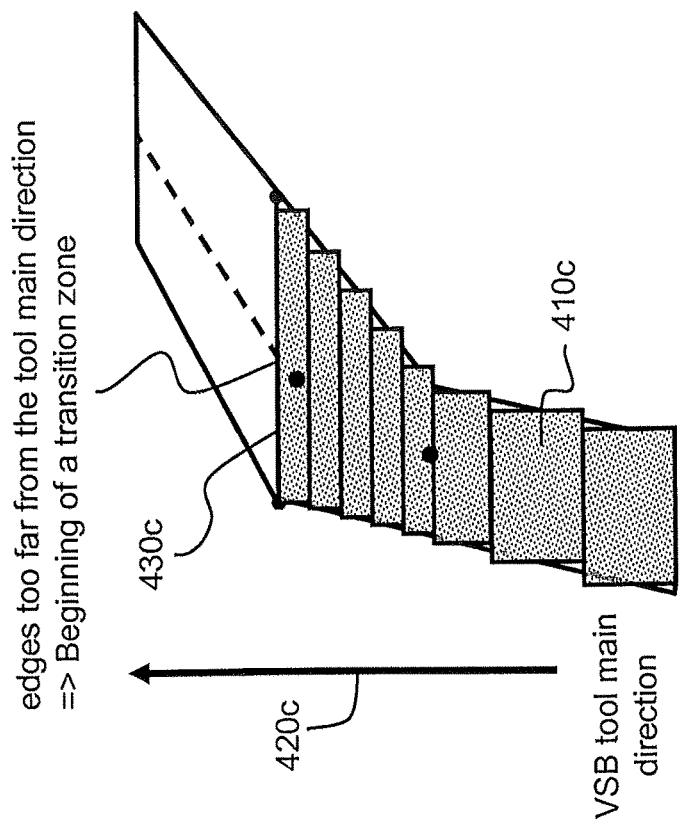
FIGS. 4b and 4c respectively represent the variables defined in a pattern to be transferred and a definition of the end condition of the algorithm, in various embodiments of the invention.
Figure 4B:
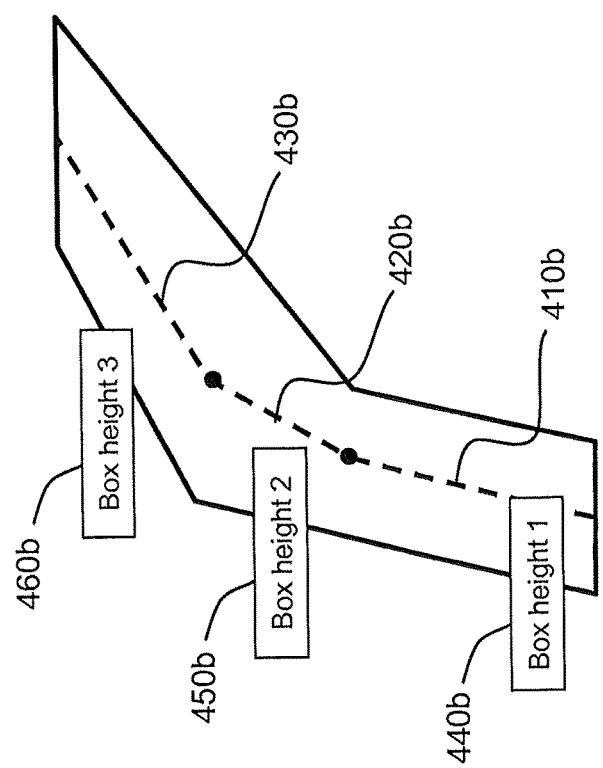

FIGS. 4b, 4c respectively represent the variables defined in a pattern to be transferred and a definition of the end condition of the algorithm, in various embodiments of the invention.

To perform the non-overlapping paving of the method of the invention, we first determine the positions of the centers of the rectangles or boxes which will be used for the paving. As represented on FIG. 4b, a way to determine the location of the centers is to approximate a medial axis (410b, 420b, 430b) of each unidirectional segment determined in the desired pattern. . The medial axis of a set of points having a boundary in a plane is defined as the set of points that have at least two closest points on the curve defining the boundaries of the set of points. See further down in the description as a medial axis can be calculated or approximated.

The width of each box will be determined so that each box overlaps the edges of the desired pattern. If the pattern is larger than the maximum shot size allowed, it is split in several boxes.

The height of the rectangles or boxes 440b, 450b and 460b is determined so as to minimize the number of boxes under the constraint that the tolerance is respected. This height can be calculated using the tolerance and the difference between the local medial axis slope and the corresponding tool available direction's slope.

Then, a condition is tested to stop the paving. This is represented on FIG. 4c In this example, the paving is stopped when the two edges of the desired pattern both form angles with one of the tool available directions which are lower than a preset value. This value is selected from the tool available directions to make a new unidirectional subpattern when another tool available direction becomes more favorable. It is typically the mean between the current tool available direction and the next tool available direction.

Figure 5A:
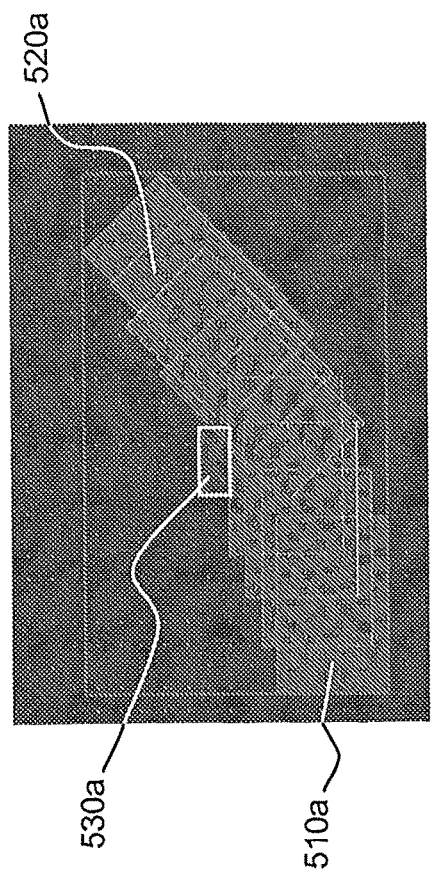
FIGS. 5a and 5b respectively represent two different modes of paving of a pattern to be transferred with overlapping shots, in various embodiments of the invention.
Figure 5B:
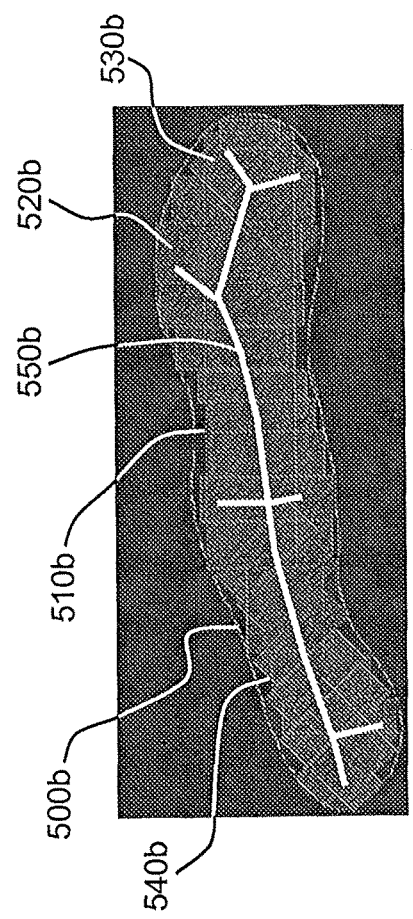

FIGS. 5a and 5b respectively represent two different modes of paving of a pattern to be transferred with overlapping shots, in various embodiments of the invention.

On FIG. 5a, one can see that paving along two dimensions is performed in an overlapping form. A first set of elementary features 510a is placed along an horizontal line. Basically all the features in the set are rectangles of the same direction and overlap of approximately the same percentage of their surface. A second set of elementary features 520a is tilted of 45° relative to the first set. The possibility to fracture a desired pattern into features which are not horizontal or vertical is not allowed by all e-beam equipments. But if this possibility is available, it opens a wide range of possibilities to optimize the design of the elementary features which can be used as a basis for fracturing.

To improve the resolution, it is possible to smooth the inner edge of the pattern by including an additional shot 530a at the corner of the desired pattern.

The desired pattern of FIG. 5b is more complex. The manner according to which it can be paved for an optimal fracturing will depend upon the exact shape of the pattern and of the type of elementary features of different orientations which will be available for fracturing by the e-beam equipment. In the example of the figure, are represented an horizontal elementary feature 510b, a vertical elementary feature 520b, an elementary feature 530b at 45° to the horizontal and an elementary feature 540b at 135° to the horizontal. We can use as a topological skeleton the medial axis of the desired pattern. The medial axis 550b of a set of points having a boundary 500b in a plane is defined as the set of points that have at least two closest points on the curve defining the boundaries of the set of points. The medial axis of a closed free form can be exactly calculated in a limited number of cases. Most often, it will be necessary to approximate the free form by a shape for which an exact calculation of the medial axis can be performed using, for example, Voronoï diagrams. Then the medial axis of the approximate form will be converted into an approximate medial axis of the initial free form. For a presentation of the techniques used to calculate approximate medial axes, see Attali and alii, "Stability and Computation of Medial Axes—a State-of-the-Art Report", In B. Hamann T. Möller and B. Russell, editors, *Mathematical Foundations of Scientific Visualization, Computer Graphics, and Massive Data Exploration*. Springer-Verlag, Mathematics and Visualization, 2007.

As an alternative, for desired patterns of a polygonal form, it may be more computationally efficient to use as a topological skeleton the straight skeleton of the form, which is the loci of the vertices of the polygons which are downsized at a uniform velocity. See Aichholzer, Oswin; Aurenhammer, Franz (1996). "Straight skeletons for general polygonal figures in the plane". Proc. $2^{nd}$ *Ann. Int. Conf. Computing and Combinatorics* (COCOON '96). Lecture Notes in Computer Science, no. 1090, Springer-Verlag. pp. 117-126.

When segments of a topological skeleton (or medial axes) are determined, we can select the directions of the tool among the available directions to be the closest to the axis of the segment being processed.

FIGS. 6a, 6b, 6c and 6d illustrate the calculation of the parameters of an overlapping paving in various embodiments of the invention.

Once the positions of the centers of the elementary features which will be used to pave the desired pattern have been determined, we need to determine the exact shape of these elementary features.

To perform this step, we take into account the following parameters which depend on the characteristics of the equipment: Maximum size of the shot for the e-beam equipment being used. (from 250 nm to 1 micron in the current equipments);

Shot tilts which are available in the e-beam equipment being used (0°, 30°, 45°, 60°, 90°, 120°, 135°, etc . . . ); the more available directions there are, the best it is, the method of the invention being capable of taking into account all the available directions;

Form of the Point Spread Function (PSF) of the e-beam equipment; this form can be defined by the distance up to which the forward scattering is effective (parameter a in this description);

The other parameter depends on the application and is defined by the tolerance between the initial shapes and the final shapes (as displayed on FIG. 4a) or maximum deviation between the initial shapes and a simulated contour; typically, the tolerance will vary, depending on the CD, from a few nanometers to a few tens of nanometers. For example roughness in the nanometer range is required for optical devices such as waveguides or resonators. For electronic devices, the roughness has to be smaller than CD/20 typically. This has to be scaled by the magnification factor if the fracturing is applied to mask writing by e-beam.

The actual positions of centers and dimensions of the elementary features used for the paving must be then calculated.

The position and tilt of the elementary features for each shot must be adjusted to minimize the difference between the surface of the union of the elementary features and the desired pattern within the roughness tolerance.

When a tilt value is not available in the e-beam equipment which is used, this can be compensated by additional overlapping.

Figure 6B:
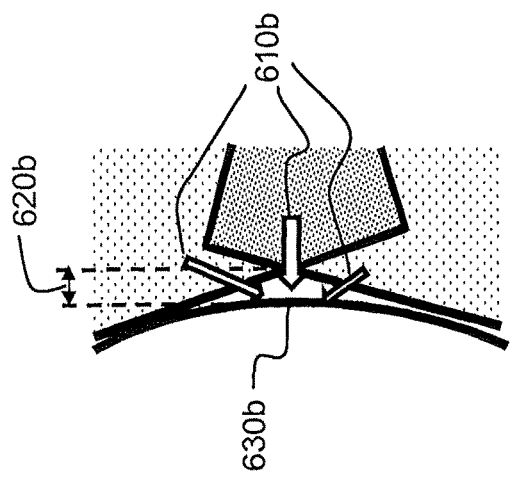
FIGS. 6a, 6b, 6c and 6d illustrate the calculation of the parameters of an overlapping paving in various embodiments of the invention.

Then, the width and length of each elementary features must be determined. With reference to FIG. 6a, the width (defined along the length of a segment of the desired curvilinear pattern) of a shot to form an elementary feature 610a is determined as a function of maximum shot size and maximum gap. The maximum gap may be calculated through different methods (simulation or look-up tables). The length 620a (defined across the width of the curvilinear desired pattern) of the elementary feature is calculated as a function of the local shape 630a of the curvilinear desired pattern. and the maximum shot size. One can note that during the step of proximity effect correction which follows the step of data preparation (or "dataprep") that we have just described, it is standard practice to include some corrections of corner rounding to increase the resolution at the corners which are a bit blurred. When we apply the dataprep of the instant invention which includes paving of a curvilinear pattern with overlapping elementary features, the corner rounding effect plays to our advantage. This is illustrated by FIGS. 6b where we can see that the proximity effect 610b creates a displacement of the resist contour to the line 630b which is distant from the bottom of the corner by a distance 620b which, from experimental results, can be anticipated to be of the order of a (a being the forward scattering parameter of the PSF).

Figure 6D:
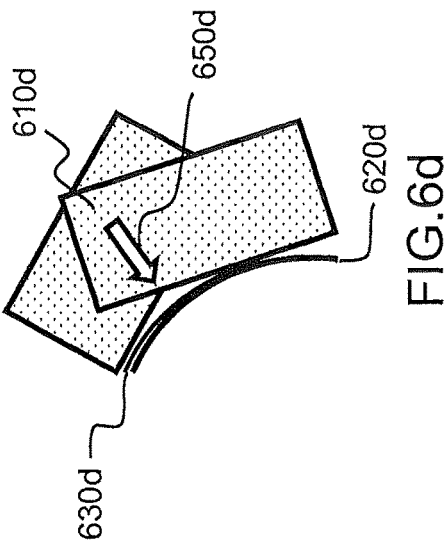
Figure 6A:
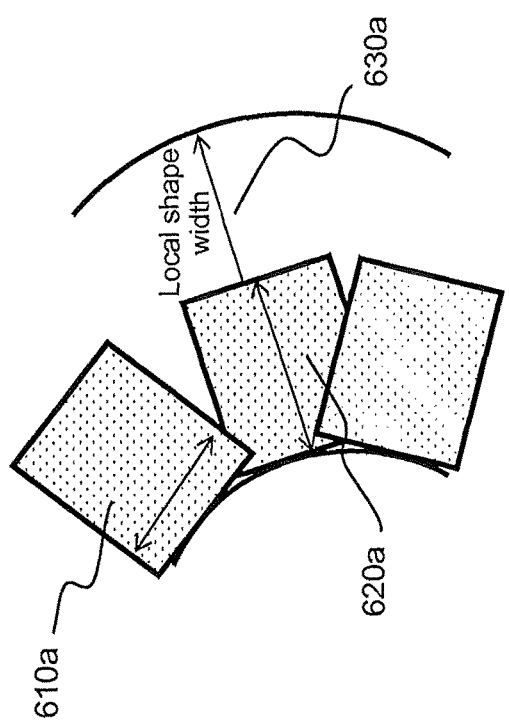
Figure 6C:
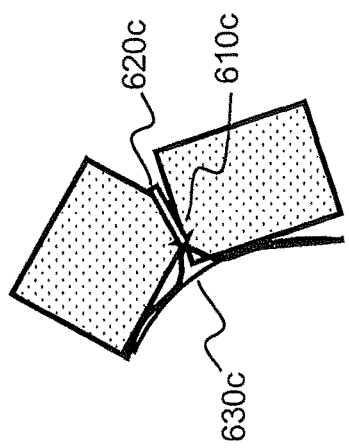

Corner rounding can be modeled. Therefore the impact on the roughness of the edges of a curvilinear desired pattern resulting from a specific configuration of paving by overlapping can be anticipated. Edge tuning can be performed during the PEC step and a loop can be established between the fracturing and PEC steps so that the amount of overlap between shots is modified to improve the result. The relationship between overlap and roughness can be assessed from a comparison between FIGS. 6c and 6d:

On FIG. 6c, the limited overlap 610c generates limited corner rounding and there is a significant difference between the simulated resist contour 620c and the contour of the desired pattern 630c;

On FIG. 6d, the significant overlap 610d generates significant proximity effect 650d which creates a corner rounding but has the nice consequence of making the simulated resist contour 620d very close to the contour of the desired pattern 630d; as a consequence, roughness will remain more easily within the tolerance.

Figure 7B:
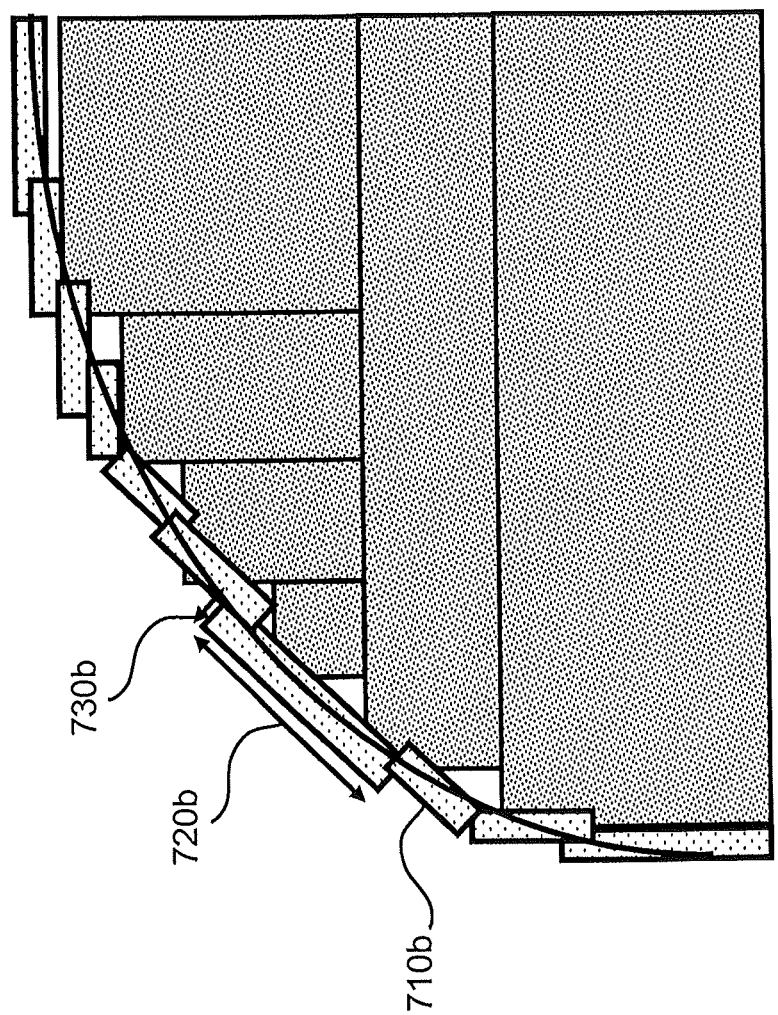
FIG. 7b illustrates the calculation of the dimensions of the eRIFs.

FIGS. 7a and 7b respectively represent two different embodiments of an addition of eRIF to a paving in various embodiments of the invention while FIG. 7b illustrates the calculation of the dimensions of the eRIFs.

When the pattern is critical in terms of resolution (CD of the desired pattern of less than $2\alpha$), it is necessary to superimpose on a first level of paving with overlapping (or possibly non overlapping shots) sub-resolution features on the edges of the pattern to be transferred. These sub-resolution features are of a dimension much smaller than the elementary features of the first paving, for instance of an order of magnitude smaller. They can be eRIF.

As can be seen on FIG. 7a, the first level of paving can be performed as explained in reference to FIG. 5b. The medial axis 710a or straight skeleton will be calculated exactly in the same manner as well as the width and length of this first set of elementary features 720a. The same parameters as the ones used for calculating the fracturing of FIG. 5b (available shot tilts, roughness tolerance, a of the PSF, maximum shot size, maximum overlap) can be used to calculate the first level of fracturing of FIG. 7a, except that the roughness tolerance can be relaxed up to several times the value of $\alpha$, since a second paving with eRIF will be performed on the edges of the pattern.

Then a second level of fracturing will be performed to place eRIFs 730a on the edges of the first fracturing. The shapes requiring eRIFs will be selected depending on their size , using a data filter based on CD.

As can be seen on FIG. 7b, the tilt 710b and length 720b of an eRIF are defined so as to follow the tilt of the edge or the medial axis or skeleton of the desired pattern. For any set of available shot tilts, any edge or medial axis or skeleton tilt, the eRIF tilt and length can be adjusted to fit the tilt of the medial axis or skeleton or edge. To do so the tilt of the eRIF can first be set to the closest value to edge tilt amongst available shot tilts. Then the length of the eRIF must take only one value to perfectly follow the tilt of the edge.

The eRIF width 730b can be defined by rules such aseRIF width=(local CD)/3.

The selection of the rule can be defined by the user of the system of the invention. To increase the accuracy of pattern printing, it is possible to reduce the width of the eRIF or to increase the dose coefficient during the subsequent PEC step to benefit from an overexposure by creating a sharper dose profile in the resist.

In the embodiment of FIG. 7c, the resolution target is more ambitious: the CD of the desired pattern is close to the resolution limit defined by the a parameter of the PSF. In this case, it is more optimal to position the eRIFs along the medial axis or skeleton 710c of the desired pattern. The shape of the eRIFs 730c will be defined as in the case of eRIFs positioned along the edges of the desired pattern (using the medial axis or skeleton to define the position of the eRIFs). In some of the embodiments of this type, the first elementary features 720c may be removed. In this case the exposure dose of the eRIFs will have to be significantly increased.

To implement the method of the invention by direct projection on semiconductor wafers or by exposure of a mask, it is possible to use, for instance, an equipment of the SB 3054 type marketed by VISTEC™. The fracturing and PEC steps can be performed with a software modified with the algorithms according to the invention of the PROX-ECCO™ brand marketed by Synopsis™, of the Beamer™ brand by Genisys™, or of the Inscale™ brand marketed by Aselta Nanographics™, the assignee of this application.

The specific implementations of the inventions will depend notably upon the shot tilts available in the fracturing equipment and software. The PEC step will be performed according to the algorithms available in the PEC software which will be used. Notably, it will be advantageous to use the Inscale™ software which provides corner rounding algorithms which can be easily adapted to the fracturing of the invention. Also, in a software of this type which implements dose modulation algorithms which use combined dose and geometry optimization of the type disclosed by U.S. application Ser. No. 13/641128. This will allow optimal integration of the fracturing according to the present invention with the PEC algorithms of this type.

This fracturing can be performed the same way if the lithography tool, uses single or multi-pass exposure because the method of the invention is robust enough so that this choice has no impact on it.

The examples disclosed in this specification are only illustrative of some embodiments of the invention. They do not in any manner limit the scope of said invention which is defined by the appended claims.

The invention claimed is:

1. A computer implemented method, comprising:
    determining a topological skeleton of a free-form desired pattern;
    determining as a parameter a threshold for a required resolution of the free-form desired pattern to be transferred onto a surface;
    determining a first set of elementary features of a resolution type to pave the free-form desired pattern;
    determining a second set of elementary features of a subresolution type to be transferred to the surface in addition to the first set of elementary features, when the required resolution is higher than the threshold parameter;
    fracturing a surface of one of a mask or a wafer into shots corresponding to the first set of elementary features and the second set of elementary features, wherein said shots are configured to be directly imprinted on the mask or the wafer by a variable shaped beam (VSB) equipment; and
    transferring the free-form desired pattern onto the surface.

2. The method of claim 1, wherein the step of determining a topological skeleton of the free-form desired pattern comprises a step of determining at least one of a medial axis and a straight skeleton of the free-form desired pattern.

3. The method of claim 2, wherein the step of determining at least one medial axis of the free-form desired pattern comprises a first step of determining an approximated form of the free-form desired pattern and a second step of applying a Voronol diagrams algorithm to the approximated form.

4. The method of claim 1, wherein the step of determining a topological skeleton of the free-form desired pattern comprises a step of determining at least one straight skeleton of the free-form desired pattern as a set of points comprising loci of vertices of polygons which are first determined as paving the free-form desired pattern.

* * * * *